US012772844B2

(12) United States Patent
Lai et al.

(10) Patent No.: US 12,772,844 B2
(45) Date of Patent: Oct. 20, 2026

(54) REDISTRIBUTION STRUCTURE WITH WARPAGE TUNING LAYER

(71) Applicant: Taiwan Semiconductor Manufacturing Co., Ltd., Hsinchu (TW)

(72) Inventors: Chieh-Lung Lai, Taichung City (TW); Meng-Liang Lin, Hsinchu (TW); Hsien-Wei Chen, Hsinchu (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 19/267,025

(22) Filed: Jul. 11, 2025

(65) Prior Publication Data

US 2025/0343102 A1 Nov. 6, 2025

Related U.S. Application Data

(62) Division of application No. 17/891,677, filed on Aug. 19, 2022, now Pat. No. 12,489,029.

(51) Int. Cl.
*H01L 23/373* (2006.01)
*H01L 21/48* (2006.01)
(Continued)

(52) U.S. Cl.
CPC ......... *H10W 40/255* (2026.01); *H10W 70/05* (2026.01); *H10W 70/65* (2026.01);
(Continued)

(58) Field of Classification Search
CPC ......... H01L 23/49838; H01L 23/49822; H01L 23/49866; H01L 23/49894; H01L 23/49833; H01L 21/4853; H01L 21/4857; H01L 23/3735; H01L 23/5383; H01L 2924/1517; H01L 2924/35–3512; H01L 23/562; H10W 42/121; H10W 20/01;
(Continued)

(56) References Cited

U.S. PATENT DOCUMENTS 8,178,964 B2 5/2012 Yang
9,000,584 B2 4/2015 Lin et al.
(Continued)

FOREIGN PATENT DOCUMENTS

TW 200839988 A 10/2008
TW 201907527 A 2/2019
TW 202218081 A 5/2022

*Primary Examiner* — Wael M Fahmy
*Assistant Examiner* — Aneesa Riaz Baig
(74) *Attorney, Agent, or Firm* — Slater Matsil, LLP

(57) ABSTRACT

A semiconductor device includes: a die having die connectors at a front side of the die; a molding material around the die; and a redistribution structure, where the die connectors of the die are attached to a first side of the redistribution structure, where the redistribution structure includes: a dielectric layer; a conductive line extending along a first surface of the dielectric layer facing the die; and a warpage tuning layer contacting and extending along a first surface of the conductive line facing the die, where a first coefficient of thermal expansion (CTE) of the conductive line is smaller than a second CTE of the warpage tuning layer.

20 Claims, 9 Drawing Sheets

(51) Int. Cl.

| | |
|---|---|
| ***H01L 23/00*** | (2006.01) |
| ***H01L 23/31*** | (2006.01) |
| ***H01L 23/498*** | (2006.01) |
| ***H10W 40/25*** | (2026.01) |
| ***H10W 42/00*** | (2026.01) |
| ***H10W 70/05*** | (2026.01) |
| ***H10W 70/65*** | (2026.01) |
| ***H10W 70/685*** | (2026.01) |
| ***H10W 72/00*** | (2026.01) |
| ***H10W 72/20*** | (2026.01) |
| ***H10W 74/10*** | (2026.01) |
| ***H10W 74/15*** | (2026.01) |
| ***H10W 90/00*** | (2026.01) |

(52) U.S. Cl.

CPC ....... *H10W 70/685* (2026.01); *H10W 72/252* (2026.01); *H10W 90/401* (2026.01); *H10W 42/121* (2026.01); *H10W 72/072* (2026.01); *H10W 72/07236* (2026.01); *H10W 72/241* (2026.01); *H10W 74/141* (2026.01); *H10W 74/142* (2026.01); *H10W 74/15* (2026.01); *H10W 90/724* (2026.01); *H10W 90/734* (2026.01)

(58) Field of Classification Search

CPC ............. H10W 90/401; H10W 90/724; H10W 90/734; H10W 90/735; H10W 90/754; H10W 90/755; H10W 90/764; H10W 90/765; H10W 90/794

See application file for complete search history.

(56) References Cited

U.S. PATENT DOCUMENTS

| | | | | |
|---|---|---|---|---|
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 10,504,880 | B2 | 12/2019 | Lin et al. | |
| 11,721,603 | B2 | 8/2023 | Chen et al. | |
| 2013/0328189 | A1* | 12/2013 | Pendse | H01L 24/16 257/737 |
| 2014/0138822 | A1* | 5/2014 | Williamson | H01L 23/49822 257/738 |
| 2015/0021762 | A1* | 1/2015 | Williamson | H01L 23/49838 257/737 |
| 2015/0357302 | A1* | 12/2015 | Chen | H01L 25/105 257/737 |
| 2019/0348344 | A1* | 11/2019 | Lu | H01L 23/49579 |
| 2020/0176396 | A1* | 6/2020 | Williamson | H01L 23/49822 |
| 2020/0211980 | A1* | 7/2020 | Huang | H01L 23/562 |
| 2021/0050306 | A1* | 2/2021 | Link | H01L 23/49816 |
| 2022/0052007 | A1* | 2/2022 | Kim | H01L 25/0655 |
| 2022/0246516 | A1* | 8/2022 | Aoki | H01L 23/145 |
| 2023/0115073 | A1* | 4/2023 | Lee | H01L 23/481 257/690 |
| 2024/0038646 | A1* | 2/2024 | Yu | H01L 24/16 |

* cited by examiner

REDISTRIBUTION STRUCTURE WITH WARPAGE TUNING LAYER

PRIORITY CLAIM AND CROSS-REFERENCE

This application is a divisional of U.S. patent application Ser. No. 17/891,677, filed Aug. 19, 2022, entitled "Redistribution Structure with Warpage Tuning Layer," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-on-Wafer-on-Substrate (CoWoS) structure. In some embodiments, to form a CoWoS structure, a plurality of semiconductor dies are attached to a wafer, and a dicing process is performed next to separate the wafer into a plurality of interposers, where each of the interposers has one or more semiconductor dies attached thereto. The interposer with semiconductor die(s) attached is referred to as a Chip-on-Wafer (CoW) structure. The CoW structure is then attached to a substrate (e.g., a printed circuit board) to form a CoWoS structure. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
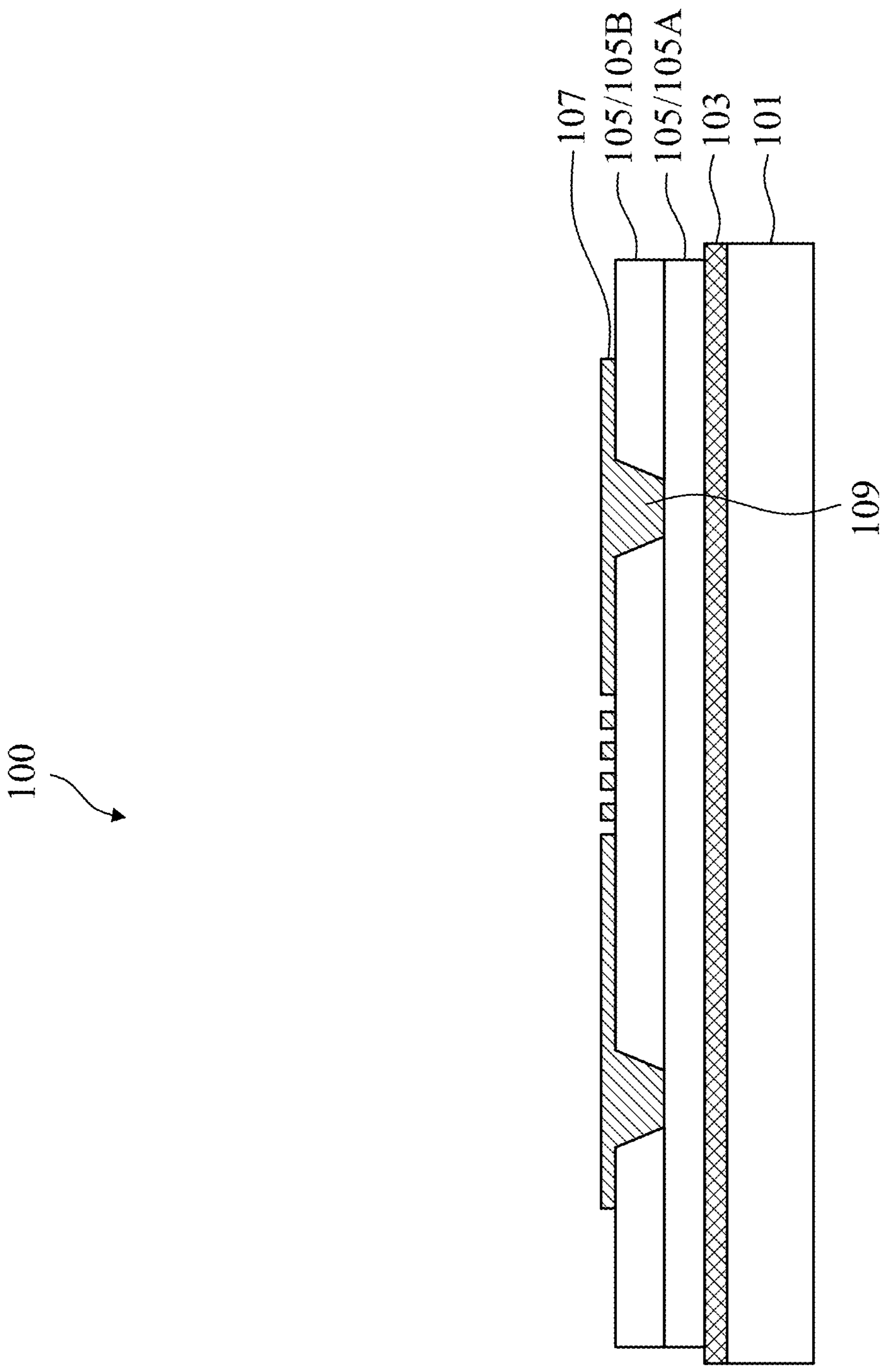
FIGS. 1, 2A, 2B, and 3-5 illustrate cross-sectional views of a semiconductor device at various stages of manufacturing, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Throughout the description, unless otherwise specified, the same or similar reference numerals in different figures refer to the same or similar component formed by a same or similar method using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a redistribution structure is formed over a carrier. The redistribution structure is formed by forming a dielectric layer over the carrier, forming a conductive line over an upper surface of the dielectric layer, and forming a warpage tuning layer contacting and extending along an upper surface of the conductive line distal from the carrier. The warpage tuning layer is formed of a material (e.g., metal) having a different (e.g., higher) coefficient of thermal expansion (CTE) than the conductive line. The bi-metallic layer comprising the conductive line and the warpage tuning layer allows the warpage profile of the structure, which comprises the carrier and the redistribution structure, to be tuned and achieve a flat profile at room temperature. The flat profile of the structure allows for easy handling of the carrier, avoids cold joint issues in a subsequent die attaching process to form a CoW structure, and improves produce reliability.

FIGS. 1, 2A, 2B, and 3-5 illustrate cross-sectional views of a semiconductor device 100 at various stages of manufacturing, in accordance with an embodiment. The semiconductor device 100 has a Chip-on-Wafer (CoW) structure, and may be referred to as a CoW device. Note that unlike conventional CoW structure, where one or more dies are attached to a wafer (e.g., a silicon wafer), a redistribution structure (see 114 in FIG. 3), instead of a wafer (e.g., a silicon wafer), is used in the semiconductor device 100 for attaching the dies. Therefore, the semiconductor device 100 is also referred to as a CoW-R device, or having a CoW-R structure, where R stands for redistribution structure.

Referring now to FIG. 1, an adhesive layer 103 is formed over a carrier 101. The carrier 101 may be made of a material such as glass, silicon, polymer, polymer composite, metal foil, ceramic, glass epoxy, beryllium oxide, tape, or other suitable material for structural support. The adhesive layer 103 (may also be referred to as a release layer) is deposited or laminated over the carrier 101, in some embodiments. The adhesive layer 103 may be photosensitive and may be easily detached from the carrier 101 by shining, e.g., an ultra-violet (UV) light on the carrier 101 in a subsequent carrier debonding process. For example, the adhesive layer may be a light-to-heat-conversion (LTHC) coating.

Next, a dielectric layer 105A is formed over the adhesive layer 103. In some embodiments, the dielectric layer 105A is formed of a polymer, such as polybenzoxazole (PBO), polyimide, benzocyclobutene (BCB), or the like. In other embodiments, the dielectric layer 105A is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 105A may be formed by any acceptable deposition process, such as spin coating, chemical vapor deposition (CVD), laminating, the like, or a combination thereof.

Next, a dielectric layer 105B is formed over the dielectric layer 105A. In some embodiments, the dielectric layer 105B is formed of a same or similar material as the dielectric layer 105A, using a same or similar formation method, thus details are not repeated. In the discussion herein, the dielectric layers 105A and 105B, and additional dielectric layer(s) formed within the redistribution structure 114 (see FIG. 3), are collectively referred to as dielectric layers 105 of the redistribution structure 114.

Next, conductive features, such as conductive lines 107 and vias 109, are formed over or in the dielectric layer 105B. Note that in the discussion herein, unless otherwise specified, the word "conductive" and the phrase "conductive feature" refer to electrically conductive and electrically conductive feature, respectively. In some embodiments, the conductive features 107/109 are formed of a suitable conductive material such as copper, titanium, tungsten, aluminum, or the like. The conductive lines 107 and the vias 109 may be formed by, e.g., forming openings in the dielectric layer 105B, forming a seed layer over the dielectric layer 105B and in the openings, forming a patterned photoresist with a designed pattern (e.g., openings) over the seed layer, plating (e.g., electroplating or electroless plating) the conductive material in the designed pattern and over the seed layer, and removing the photoresist and portions of seed layer on which the conductive material is not formed. Besides the method described above, other methods to form the conductive features 107/109 are also possible, and are fully intended to be included within the scope of the present disclosure.

Next, in FIG. 2, a warpage tuning layer 111 is formed over the conductive lines 107. In some embodiments, the warpage tuning layer 111 is formed of a conductive material (e.g., a metal material) having a coefficient of thermal expansion (CTE) different from that of the conductive line 107. In an example embodiment, the CTE of the warpage tuning layer 111 is higher than the CTE of the conductive line 107. For example, the conductive line 107 (and the via 109) may be formed of copper (e.g., having a CTE of 16.5), and the warpage tuning layer 111 may be formed of aluminum (e.g., having a CTE of 23.2). Besides aluminum, other suitable metals having a higher CTE than the conductive line 107, such as silver, tin, or the like, may also be used. In some embodiments, the CTE of the warpage tuning layer 111 is chosen such that a difference between the CTE of the warpage tuning layer 111 and the CTE of the conductive line 107, referred to as CTE gap, is larger than a pre-determined value (e.g., 6). In an example embodiment, the conductive line 107 is formed of copper and has a Young's modulus of 124 GPa, and the warpage tuning layer 111 is formed of aluminum and has a Young's modulus of 69 GPa. As will be discussed in details hereinafter, the CTE gap, along with other design parameters, such as thicknesses, or stiffnesses (e.g., Young's modulus), of the conductive line 107 and the warpage tuning layer 111, are tuned to achieve a target warpage profile.

In some embodiments, the warpage tuning layer 111 is formed using a suitable formation method, such as PVD, electroplating, or the like. In an example embodiment, the warpage tuning layer 111 is formed using the same mask layer (e.g., patterned photoresist) used for forming the conductive features 107/109, and therefore, the warpage tuning layer 111 may overlap (e.g., completely overlaps, or completely covers) the underlying conductive line 107. Next, portions of the warpage tuning layer 111 are removed to expose regions of the upper surfaces of the conductive lines 107. An etching process, such as an anisotropic etching process, may be performed using another mask layer to remove the portions of the warpage tuning layer 111.

Figure 2A:
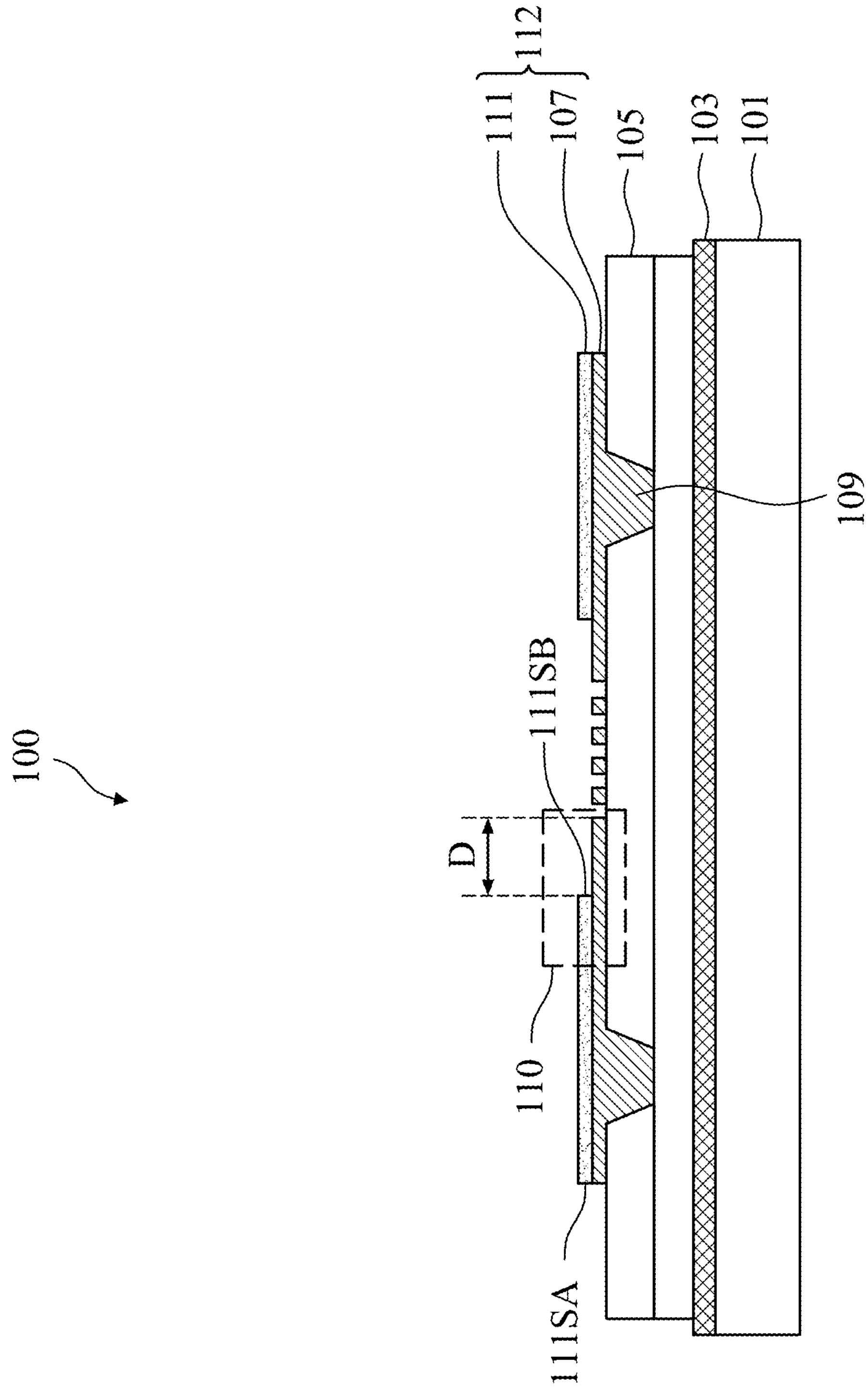

As illustrated in FIG. 2A, after removing the portions of the warpage tuning layer 111, a width of the warpage tuning layer 111, measured between opposing sidewalls of the warpage tuning layer 111 (e.g., along the horizontal direction of FIG. 2A), is smaller than a width of the underlying conductive line 107 measured between opposing sidewalls of the conductive line 107 (e.g., along the horizontal direction of FIG. 2A), such that a sidewall 111SB of the warpage tuning layer 111 is recessed from a respective sidewall of the underlying conductive line 107. In the example of FIG. 2A, a sidewall 111SA of the warpage tuning layer 111 is flush (e.g., vertically aligned) with a respective sidewall (e.g., left sidewall in FIG. 2A) of the underlying conductive line 107, and a sidewall 111SB of the warpage tuning layer 111 is recessed from a respective sidewall (e.g., right sidewall in FIG. 2A) of the underlying conductive line 107, such that there is a laterally offset D between the two sidewalls. The lateral offset D causes regions of the upper surfaces of the conductive lines 107 to be exposed, which allows subsequently formed vias 109 to be in contact with (e.g., physically contacts) the upper surfaces of the conductive line 107.

In FIG. 2A, the warpage tuning layer 111 contacts (e.g., physically contacts) and extends along the upper surface of the conductive line 107. In the discussion herein, the warpage tuning layer 111 and its corresponding underlying conductive line 107 are collectively referred to as a bi-metallic layer 112.

Figure 2B:
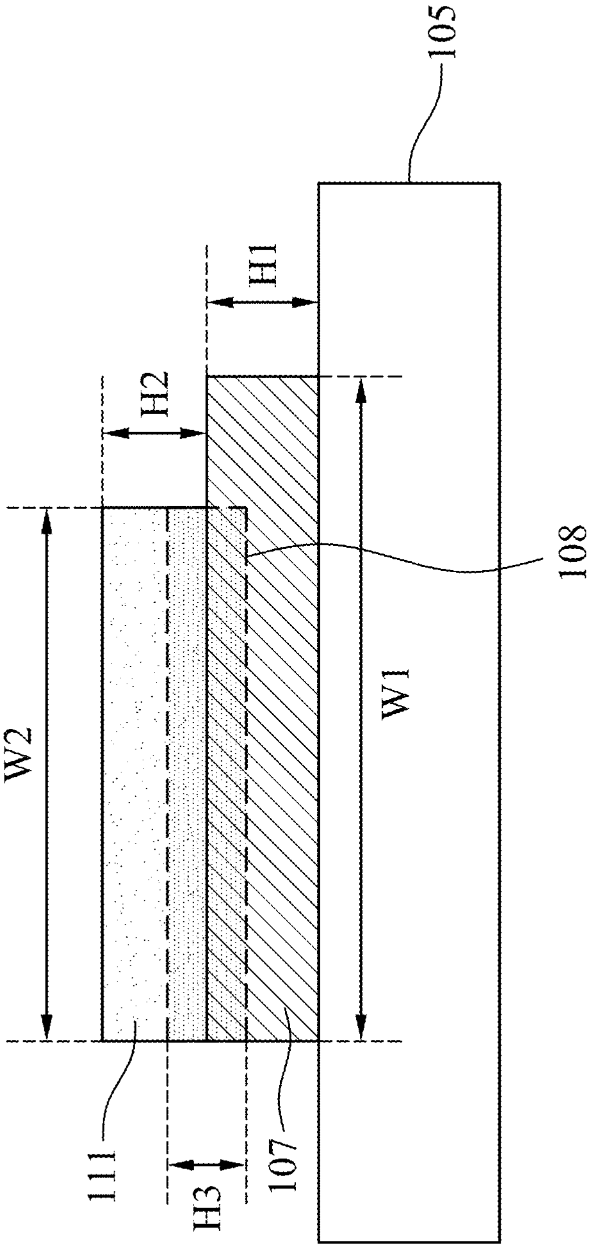

FIG. 2B shows a zoomed-in view of a portion of the semiconductor device 100 in an area 110 of FIG. 2A. As illustrated in FIG. 2B, a ratio R1 between a width W2 of the warpage tuning layer 111 and a width W1 of the conductive line 107 may be between 0.2 and 1.0 (e.g., $0.2 \le W2/W1 \le 1.0$). A thickness H2 of the warpage tuning layer 111 may be between 0.5 μm and 5 μm. A thickness H1 of the conductive line 107 may be between 0.05 μm and 50 μm, such as between 2 μm and 5 μm. A ratio R2 between the thickness H2 of the warpage tuning layer 111 and the thickness H1 of the conductive line 107 may be between 0 and 100, (e.g., $0 < H2/H1 \le 100$), such as between 0 and 1.5, or between 0 and 10. In some embodiments, if the ration R2 is too large (e.g., larger than 1.5), the total height of the bi-metallic layer 112 (e.g., H1+H2) may be too large compared with a reference design without the warpage tuning layer 111, and since the thickness of the subsequently formed dielectric layers 105 will be increased to accommodate the thickness of the bi-metallic layer 112, the redistribution structure 114 formed may be too thick, which reduces the integration density of the semiconductor device 100.

In some embodiments, an inter-metallic compound (IMC) layer 108 is formed in a region disposed on both sides of the interface between the conductive line 107 and the warpage tuning layer 111. A thickness H3 of the IMC layer 108 may be between 0 μm and 5 μm (e.g., $0 < H3 \le 5$ μm), as an example.

Figure 3:
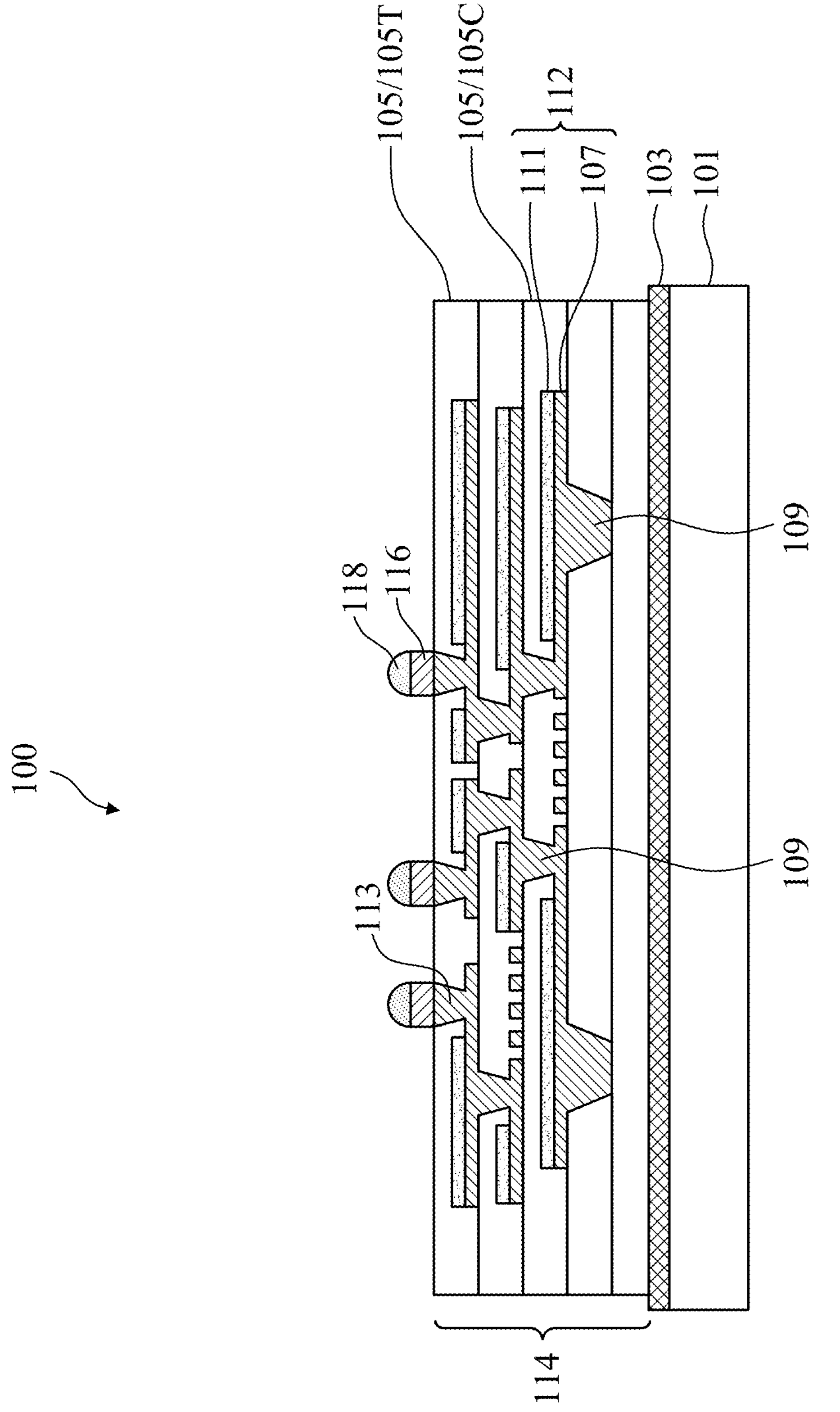

Next, in FIG. 3, a dielectric layer 105C is formed over the bi-metallic layer 112 of FIG. 2A, and another bi-metallic layer 112 is formed over the dielectric layer 105C, using the same or similar processing discussed above. The processing repeats until a target number of bi-metallic layers 112 are formed in the redistribution structure 114. After the topmost bi-metallic layer 112 (e.g., furthest from the carrier 101) is formed, a top dielectric layer 105T is formed over the topmost bi-metallic layer 112. FIG. 3 further illustrates conductive feature 113 (e.g., copper pads, copper vias) formed in the top dielectric layer 105T and electrically coupled to the topmost bi-metallic layer 112. The dielectric layers 105, the conductive features 107/109/113, and the warpage tuning layers 111 are collectively referred to as the redistribution structure 114, in some embodiments. The number of layers of the dielectric layers 105 and the number of layers of the bi-metallic layers 112 illustrated in FIG. 3 is merely a non-limiting example, other numbers are also possible and are fully intended to be included within the scope of the present disclosure.

Next, under bump metallization (UBM) structures 116 are formed over the top dielectric layer 105T, and is electrically coupled to the conductive feature 113 of the redistribution structure 114. The UBM structures 116 provides an electrical connection upon which an electrical connector, e.g., a solder ball/bump, a conductive pillar, or the like, may be placed. In an embodiment, the UBM structure 116 includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, the UBM structure 116 is formed using sputtering. In other embodiments, electro plating may be used.

Next, external connectors 118 (also referred to as conductive bumps) are formed on the UBM structures 116. In an embodiment, the external connectors 118 are conductive bumps such as micro-bumps and comprise a material such as tin, or other suitable materials, such as silver or copper. In an embodiment in which the external connectors 118 are tin solder bumps, the external connectors 118 may be formed by initially forming a layer of tin through any suitable method such as evaporation, electroplating, printing, solder transfer, ball placement, or the like. Once a layer of tin has been formed on the structure, a reflow is performed in order to shape the material into the bump shape.

However, while the external connectors 118 have been described above as C4 bumps, these are merely intended to be illustrative and are not intended to limit the embodiments. Rather, any suitable type of external contacts, such as ball grid arrays (BGAs), micro-bumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 118, and all such external connectors are fully intended to be included within the scope of the embodiments.

In subsequent processing, one or more dies (see 131 in FIG. 4) are attached to the redistribution structure 114 to form the CoW-R structure. As more and more dies with different functionalities are attached to the redistribution structure 114 to achieve high levels of integration in the CoW-R package (e.g., the semiconductor device 100), the size (e.g., surface area) of the redistribution structure 114 and the size of the carrier 101 may increase to accommodate the large number of dies. Due to the large size of the redistribution structure 114/carrier 101, it is increasing difficult to keep the structure shown in FIG. 3 flat (e.g., having planar upper/lower surfaces), and warpage control for the semiconductor device 100 becomes an increasingly important issue. Warpage in semiconductor devices is generally caused by the differences in the coefficients of thermal expansion (CTEs) of the different materials used in the semiconductor device. As the different materials expand or contract at different rates with temperature changes, stress is produced in various region of the semiconductor device, and the stress may result in warpage of the semiconductor device.

The CTEs of the different layers of materials in the redistribution structure 114 and the CTE of the carrier 101, together with other factors, such as the thickness, or the stiffness of the different layers of materials, interact to determine the planarity (e.g., the amount of warpage) of the structure in FIG. 3. The present disclosure allows tuning of the warpage of the structure in FIG. 3 using the warpage tuning layer 111. In some embodiments, the CTE of the warpage tuning layer 111, the thickness H2 of the warpage tuning layer 111, and/or the stiffness (e.g., Young's modulus) of the warpage tuning layer 111 are adjusted to achieve a target amount of warpage for the semiconductor structure of FIG. 3. For example, to achieve a given warpage profile, a high CTE of the warpage tuning layer 111 may allow the use of a thinner (e.g., having smaller H2) warpage tuning layer 111, or a softer (e.g., a smaller Young's modulus) warpage tuning layer 111. Conversely, a low CTE of the warpage tuning layer 111 may need a thicker (e.g., having larger H2) warpage tuning layer 111, or a stiffer (e.g., a higher Young's modulus) warpage tuning layer 111.

To appreciate the advantage of the present disclosure, consider a reference design similar to FIG. 3, but with the warpage tuning layers 111 removed. In some embodiments, the interaction between the redistribution structure 114 and the carrier 101 achieves a good planarity (e.g., the carrier 101 has flat upper/lower surfaces) for the reference design at a high temperature, e.g., during formation of the redistribution structure 114. However, after the redistribution structure 114 is formed and the reference design cools down to a room temperature, due to the high CTEs of the materials used in the redistribution structure 114, the redistribution structure 114 may shrink more than the carrier 101, resulting in a "smiley face" type of warpage in the reference design. For example, the middle portion of the carrier 101 (or the redistribution structure 114) of the reference design is lower than the left and right end portions of the carrier 101 (or the redistribution structure 114). Warpage in the reference design may cause problem for manufacturing. For example, since the carrier 101 is not flat, it may be difficult for the robot arm to hold the carrier 101 and transfer the reference design between different processing chambers of the manufacturing tool. In addition, warpage in the redistribution structure 114 may make it difficult to attach the dies 131 to the external connectors 118, and may results in cold joints and product defects.

In contrast, the present disclosure, but using the warpage tuning layers 111 (e.g., with high CTE), achieves improved planarity for the structure in FIG. 3 at room temperature by pre-distorting the structure in FIG. 3 at high temperature toward a "cry face" type of warpage profile to compensate for (or counteract) the "smiley face" type of warpage at room temperature. For example, the high CTE of the warpage tuning layers 111 may cause the structure in FIG. 3 to have a "cry face" type of warpage at a high temperature (e.g., when the redistribution structure 114 is being formed), where the middle portion of the carrier 101 (or the redistribution structure 114) is higher than the left and right end portions of the carrier 101 (or the redistribution structure 114). After the redistribution structure 114 is formed and the structure in FIG. 3 cools down to a room temperature, due to the high CTEs of the materials used in the redistribution structure 114, the redistribution structure 114 may shrink more than the carrier 101, which reduces or corrects the "cry face" type of warpage, and results in a substantially planar profile for the semiconductor structure of FIG. 3. The flat surfaces of the carrier 101 and the redistribution structure 114 make it easier to handle the carrier 101, avoid cold joint issues, and improve product reliability.

Figure 4:
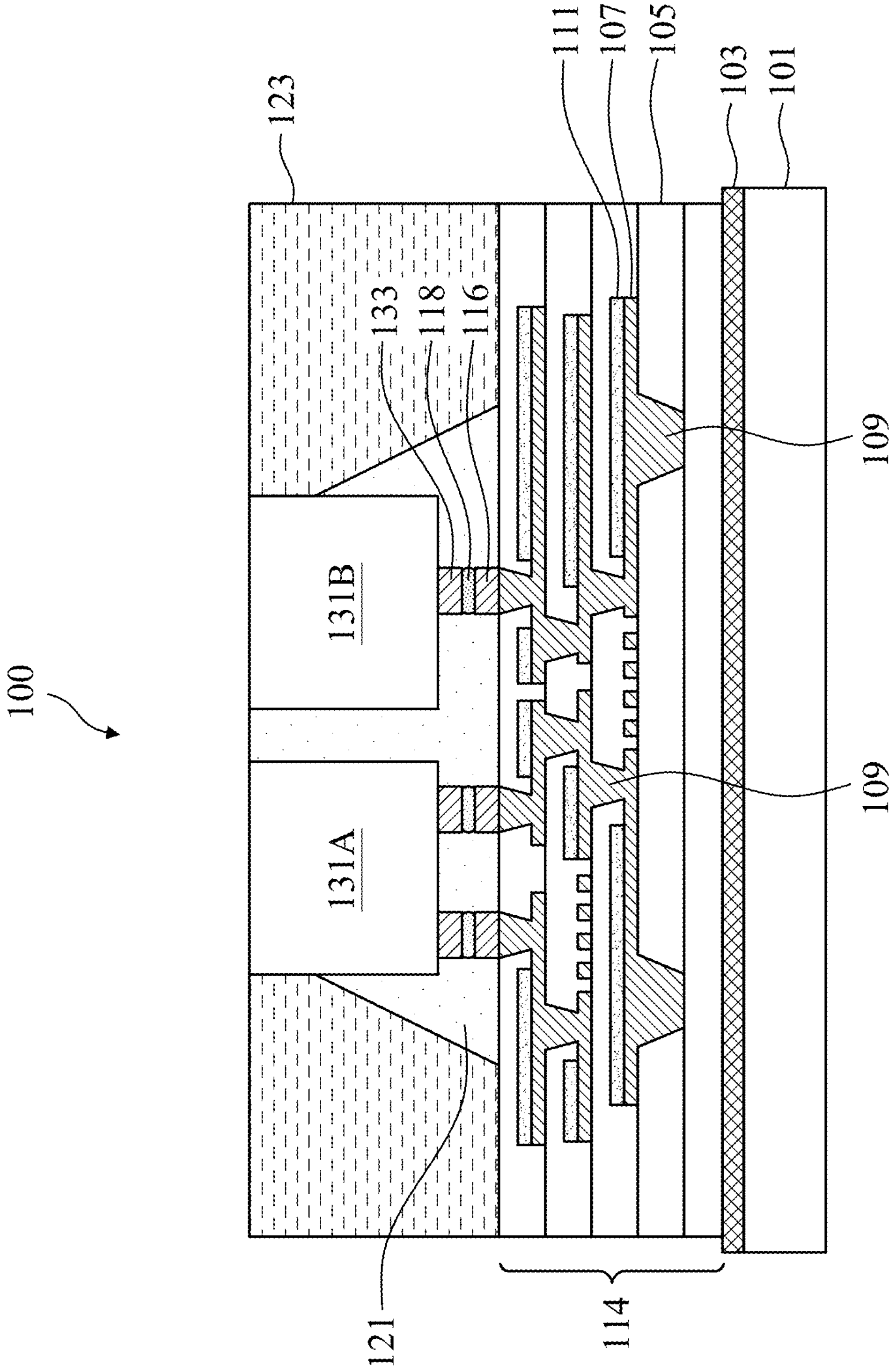

Next, in FIG. 4, one or more dies 131 (e.g., 131A and 131B) are attached (e.g., bonded) to the external connectors 118, e.g., by a reflow process. A solder region may be formed between die connectors 133 of the dies 131 and the external connectors 118. FIG. 4 further illustrates an underfill material 121 between the dies 131 and the redistribution structure 114, and a molding material 123 around the dies 131 and around the underfill material 121.

The dies 131A and 131B are collectively referred to as dies 131 in the discussion herein. The dies 131 may also be referred to as semiconductor dies, chips, or integrated circuit (IC) dies. The dies 131 are a same type of dies (e.g., memory dies, or logic dies), in some embodiments. In other embodiments, the dies 131 are of different types. For example, the die 131A may be a System-On-a-Chip (SOC) die that includes, e.g., a central processing unit (CPU), memory interfaces, Input/Output (I/O) devices, and I/O interfaces. The die 131B may be, e.g., a memory die, such as a High-Bandwidth Memory (HBM) die, or a chiplet that contains a well-defined subset of functionalities for integration with the die 131A. The number of dies 131, and the type of dies 131 illustrated in FIG. 4 is simply a non-limiting example. Other numbers of dies, other types of dies, or other arrangement (e.g., placement) of the dies are also possible, and are fully intended to be included within the scope of the present disclosure.

In some embodiments, each of the dies 131 includes a substrate, electrical components (e.g., transistors, resistors, capacitors, diodes, or the like) formed in/on the substrate, and an interconnect structure over the substrate connecting the electrical components to form functional circuits of the die 131. The die 131 also includes conductive pillars 133 (also referred to as die connectors) that provide electrical connection to the circuits of the die 131.

The substrate of the die 131 may be a semiconductor substrate, doped or undoped, or an active layer of a silicon-on-insulator (SOI) substrate. Generally, an SOI substrate comprises a layer of a semiconductor material such as silicon, germanium, silicon germanium, silicon germanium on insulator (SGOI), or combinations thereof. Other substrates that may be used include multi-layered substrates, gradient substrates, or hybrid orientation substrates.

The electrical components of the die 131 comprise a wide variety of active devices (e.g., transistors) and passive devices (e.g., capacitors, resistors, inductors), and the like. The electrical components of the die 131 may be formed using any suitable methods either within or on the substrate of the die 131. The interconnect structure of the die 131 comprises one or more metallization layers (e.g., copper layers) formed in one or more dielectric layers, and is used to connect the various electrical components to form functional circuitry. In an embodiment, the interconnect structure is formed of alternating layers of dielectric and conductive material (e.g., copper) and may be formed through any suitable process (such as deposition, damascene, dual damascene, etc.).

One or more passivation layers (not shown) may be formed over the interconnect structure of the die 131 in order to provide a degree of protection for the underlying structures of the die 131. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized.

Conductive pads (not shown) may be formed over the passivation layer and may extend through the passivation layer to be in electrical contact with the interconnect structure of the die 131. The conductive pads may comprise aluminum, but other materials, such as copper, may also be used.

Conductive pillars 133 of the die 131 are formed on the conductive pads to provide conductive regions for electrical connection to the circuits of the die 131. The conductive pillars 133 may be copper pillars, contact bumps such as micro-bumps, or the like, and may comprise a material such as copper, tin, silver, or other suitable material.

After the dies 131 are bonded to the redistribution structure 114 through the external connectors 118, the underfill material 121 is formed between the dies 131 and the redistribution structure 114. The underfill material 121 may, for example, comprise a liquid epoxy that is dispensed in a gap between the dies 131 and the redistribution structure 114, e.g., using a dispensing needle or other suitable dispensing tool, and then cured to harden. As illustrated in FIG. 4, the underfill material 121 fills the gap between the dies 131 and the redistribution structure 114, and may also fill gaps between adjacent dies 131. In addition, the underfill material 121 may extend along sidewalls of dies 131. In other embodiments, the underfill material 121 is omitted.

Next, the molding material 123 is formed over the redistribution structure 114 and around the dies 131. The molding material 123 also surrounds the underfill material 121 in embodiments where the underfill material 121 is formed. The molding material 123 may comprise an epoxy, an organic polymer, a polymer with or without a silica-based filler or glass filler added, or other materials, as examples. In some embodiments, the molding material 123 comprises a liquid molding compound (LMC) that is a gel type liquid when applied. The molding material 123 may also comprise a liquid or solid when applied. Alternatively, the molding material 123 may comprise other insulating and/or encapsulating materials. The molding material 123 is applied using a wafer level molding process in some embodiments. The molding material 123 may be molded using, for example, compressive molding, transfer molding, molded underfill (MUF), or other methods.

Next, the molding material 123 is cured using a curing process, in some embodiments. The curing process may comprise heating the molding material 123 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 123 may be cured using other methods. In some embodiments, a curing process is not included.

After the molding material 123 is formed, a planarization process, such as chemical and mechanical planarization (CMP), may be performed to remove excess portions of the molding material 123 from over the dies 131, such that the molding material 123 and the backsides of the dies 131 have a coplanar upper surface.

Figure 5:
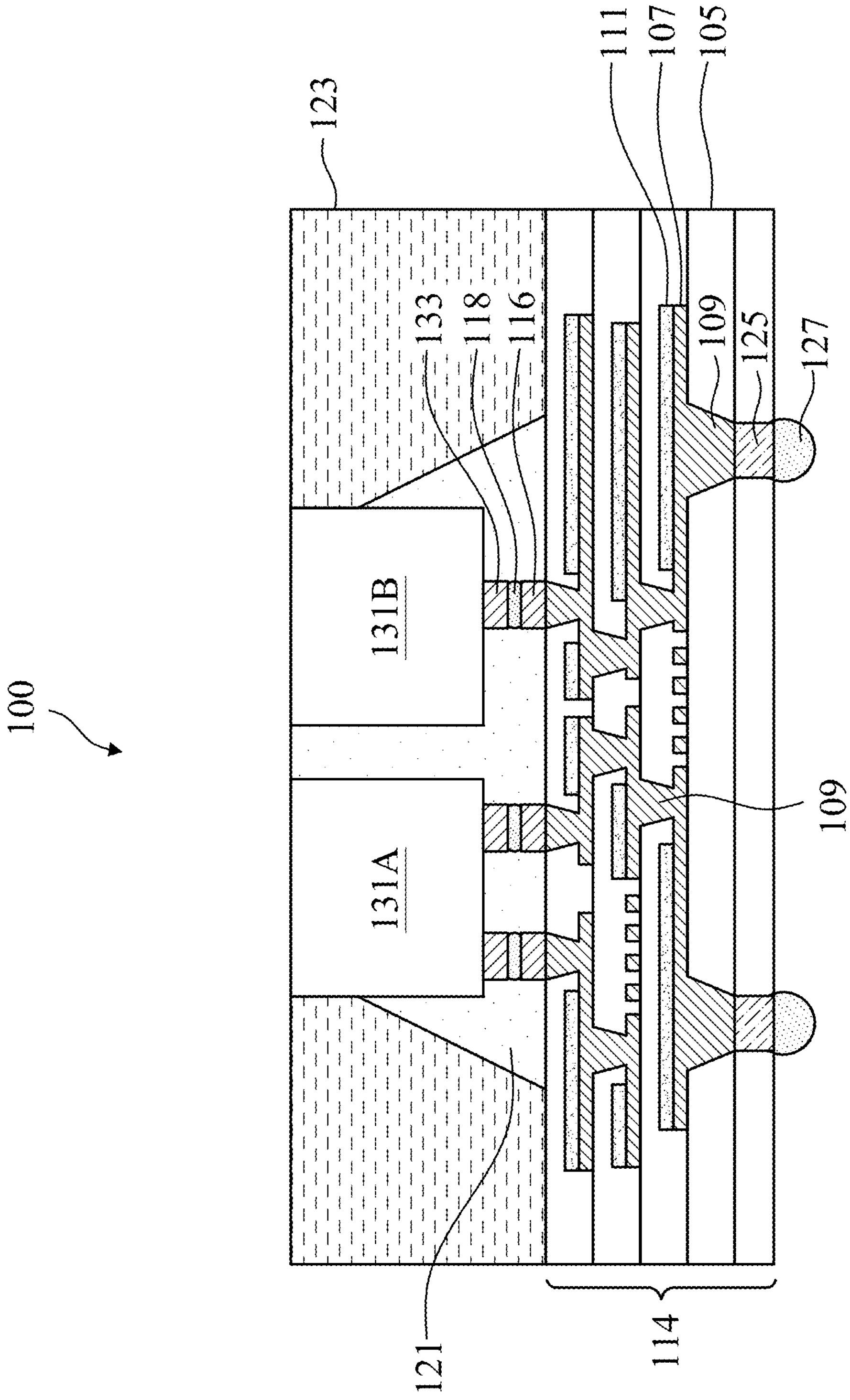

Next, in FIG. 5, the backsides of the dies 131 are attached to a carrier (not shown), e.g., by an adhesive layer. The carrier and the adhesive layer may be the same as or similar to the carrier 101 and the adhesive layer 103 in FIG. 1, respectively, thus details are not repeated. Next, external connectors 125 (also referred to conductive connectors) are formed at a lower side of the redistribution structure 114 in FIG. 5 and are electrically coupled to the redistribution structure 114. The external connectors 125 may be controlled collapse chip connection (C4) bumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like. Solder regions 127 may be formed on the external connectors 125.

The semiconductor device 100 illustrated in FIG. 5 has a CoW-R structure. One skilled in the art will readily appreciate that during manufacturing, the redistribution structure 114 formed on the carrier 101 in FIG. 3 may include multiple regions, where each of the multiple region is for attaching dies 131 to form a respective CoW-R structure. Therefore, multiple CoW-R structures may be formed at the same time, and a dicing process may be performed next to separate the multiple CoW-R structures to form a plurality of individual CoW-R structures as shown in FIG. 5. Details of the dicing process are not discussed here.

Figure 6:
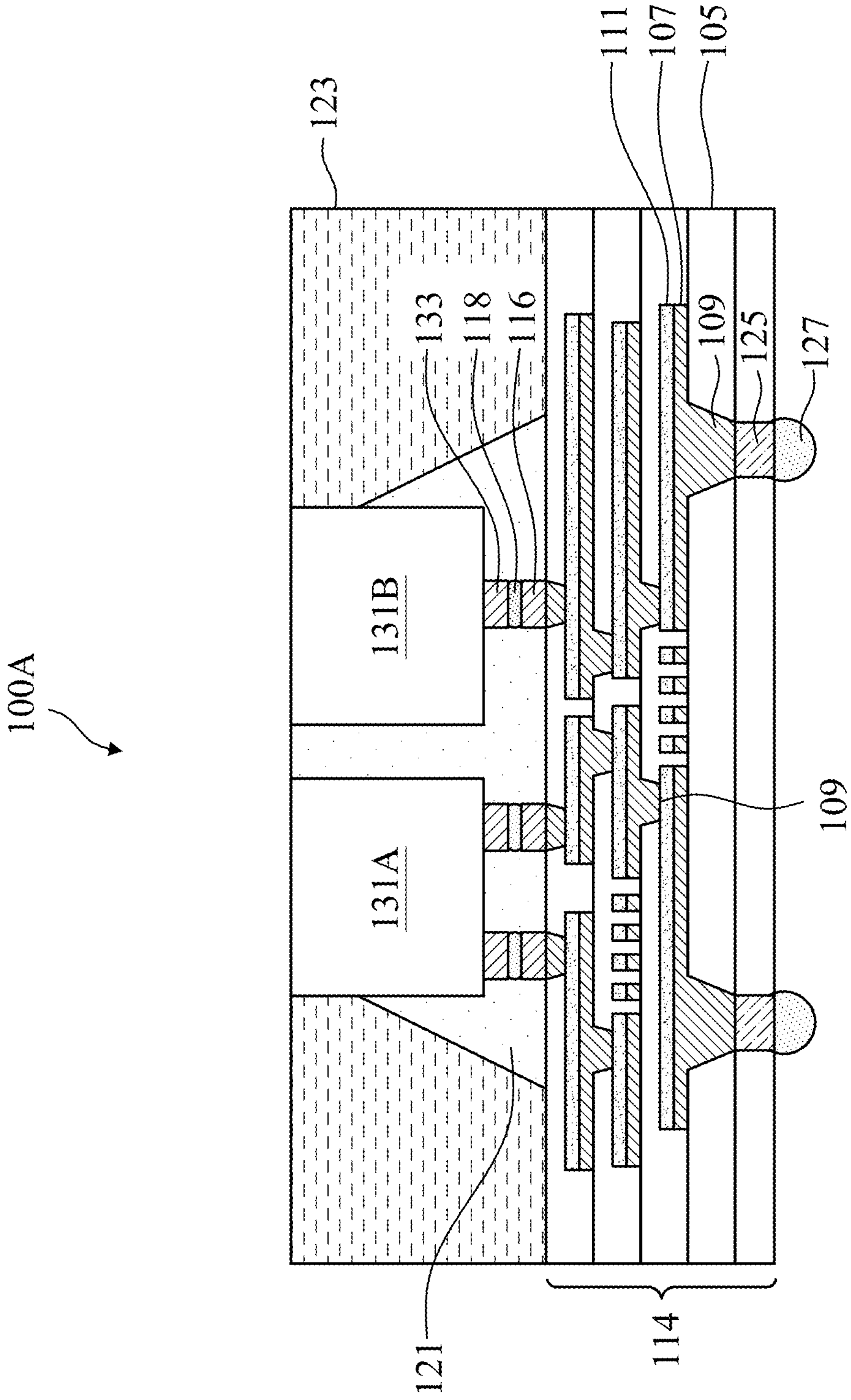
FIG. 6 illustrates a cross-sectional view of a semiconductor device, in accordance with an embodiment.

FIG. 6 illustrates a cross-sectional view of a semiconductor device 100A, in accordance with an embodiment. The semiconductor device 100A (e.g., a CoW-R structure) is similar to the semiconductor device 100 of FIG. 5, but the warpage tuning layer 111 of the semiconductor device 100A covers (e.g., completely covers) the upper surface of the underlying conductive line 107.

In some embodiments, the semiconductor device 100A is formed following the similar processing for the semiconductor device 100, but without the extra etching process to remove portions of the warpage tuning layer 111 to expose regions of the upper surfaces of the conductive lines 107. For example, at the processing of FIG. 2A, the warpage tuning layer 111 is formed using the same mask layer (e.g., patterned photoresist) used for forming the conductive features 107/109, but the etching process to form the lateral offset D in FIG. 2A is omitted. Therefore, the warpage tuning layer 111 covers (e.g., completely covers) the upper surface of the underlying conductive line 107. For example, opposing sidewalls of the warpage tuning layer 111 are flush (e.g., vertically aligned) with respective sidewalls of the underlying conductive line 107. This simplifies the processing, since the etching process and the new mask layer for the etching process can be omitted. As a result, the vias 109 over the warpage tuning layer 111 is formed to contact (e.g., physically contact) the warpage tuning layer 111, as illustrated in FIG. 6. However, if the electrical conductivity of the warpage tuning layer 111 (e.g., aluminum) is lower than that of the conductive line 107 (e.g., copper), the electrical resistance of the redistribution structure 114 of the semiconductor device 100A may be higher than that of the semiconductor device 100.

Figure 7:
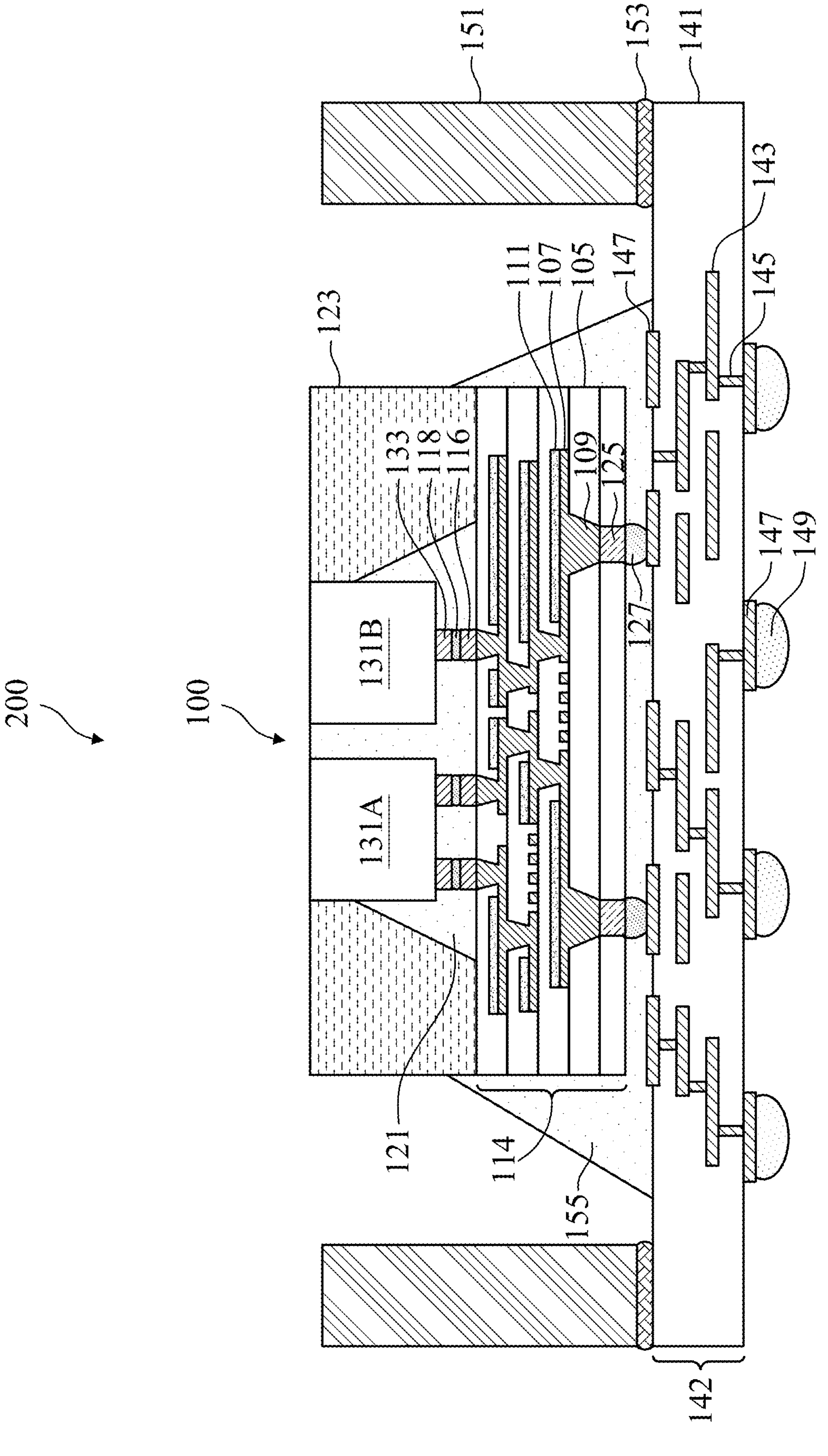
FIG. 7 illustrates a cross-sectional view of a semiconductor device, in accordance with an embodiment.

FIG. 7 illustrates a cross-sectional view of a semiconductor device 200, in accordance with an embodiment. The semiconductor device 200 is formed by bonding the semiconductor device 100 (e.g., a CoW package) in FIG. 5 to a substrate 142 to form a Chip-on-Wafer-on-Substrate (CoWoS) structure.

Looking at the substrate 142, the substrate 142 is a multiple-layer circuit board (e.g., printed circuit board (PCB)), in some embodiments. For example, the substrate 142 may include one more dielectric layers 141 formed of bismaleimide triazine (BT) resin, FR-4 (a composite material composed of woven fiberglass cloth with an epoxy resin binder that is flame resistant), ceramic, glass, plastic, tape, film, or other supporting materials. The substrate 142 may include electrically conductive features (e.g., conductive lines 143 and vias 145) formed in or on the substrate 142. As illustrated in FIG. 12, the substrate 142 has conductive pads 147 formed on the upper surface and the lower surface of the substrate 142, which conductive pads 147 are electrically coupled to the conductive features of the substrate 142.

In some embodiments, to form the semiconductor device 200, the external connectors 125 of the semiconductor device 100 are aligned with respective conductive pads 147 on the upper surface of the substrate 142, and a reflow process is performed to bond the external connectors 125 to the conductive pads 147, e.g., through solder regions 127. Next, an underfill material 155 is formed between the redistribution structure 114 and the substrate 142. The underfill material 155 may be the same as or similar to the underfill material 121, and may be formed by a same or similar formation method, thus details are not repeated.

Next, a ring 151 is attached to the upper surface of the substrate 142 by an adhesive material 153, and is used to improve the planarity (e.g., flatness) of the substrate 142. In some embodiments, the ring 151 is formed of a rigid material, such as steel, copper, glass, or the like. In some embodiments, the ring 151 is a rectangular ring (e.g., having a hallow rectangle shape in a top view), and is attached to substrate 142 such that the ring 151 surrounds the semiconductor device 100. The ring 151 is attached to the upper surface of the substrate 142 after the CoWoS structure is formed, in some embodiments. In other embodiments, the ring 151 is attached to the upper surface of the substrate 142 first, and thereafter, the semiconductor device 100 is attached to the upper surface of the substrate 142 inside the ring 151. Skilled artisans will readily appreciate that the semiconductor device 100A of FIG. 6 may also be bonded to the substrate 142 to form a CoWoS structure, details are not discussed here. In some embodiments, the ring 151 may be replaced by a lid to achieve the same or similar functions. The lid may have vertical extending portions similar to the ring 151, and may include a horizontal portion over (e.g., covering) the semiconductor device 100. A thermal interface material (TIM) may be used between and contacting the horizontal portion of the lid and the semiconductor device 100 to facilitate heat dissipation.

Variations to the disclosed embodiments are possible and are fully intended to be included within the scope of the present disclosure. For example, while the warpage tuning layer 111 is illustrated as being formed of a metal material (e.g., aluminum) in the illustrated embodiments, non-metal material, or non-electrically conductive material, with the same or similar CTE as the metal warpage tuning layer, is also contemplated for the semiconductor device 100. Since the overlying via 109 is coupled to the exposed upper surface of the conductive line 107 in the semiconductor device 100, a non-metal material (or a non-electrically conductive material) still allows for proper functioning of the redistribution structure 114. As another example, while the warpage tuning layer 111 is illustrated as being formed on each layer of conductive lines 107, it is possible to form the warpage tuning layer 111 on some, but not all, of the layers of conductive lines 107. As yet another example, while a bi-metallic layer is shown in the illustrated embodiments, two or more warpage tuning layers having successively larger CTEs may be formed on the conductive line 107 to form a multi-metallic layer for warpage tuning. For example, the multi-metallic layer for warpage tuning may include a first warpage tuning layer (e.g., a metal layer) formed on the conductive line 107 and having a first CTE larger than the CTE of the conductive line 107, and may include a second warpage tuning layer (e.g., another metal layer) formed on the first warpage tuning layer and having a second CTE larger than the first CTE, and so on. Therefore, the bi-metallic layer may be considered a special case of the multi-metallic layer, with only one warpage tuning layer 111 formed on the conductive line 107. These are other variations are fully intended to be included within the scope of the present disclosure.

Embodiments may achieve advantages. For example, the warpage tuning layer 111 allows the warpage profile of the semiconductor device 100 (or the structure in FIG. 3) to be tuned to a target profile to reduce warpage at room temperature. In some embodiments, the warpage tuning layer 111 pre-distorts the structure in FIG. 3 at high temperature to compensate for, or counteract, expected warpage at room temperature. As a result, a planar profile (e.g., flat upper/lower surfaces) for the semiconductor device 100 and the carrier 101 is achieved at room temperature, which makes it easier to handle the carrier 101, avoid cold joint issues, and improve product reliability.

Figure 8:
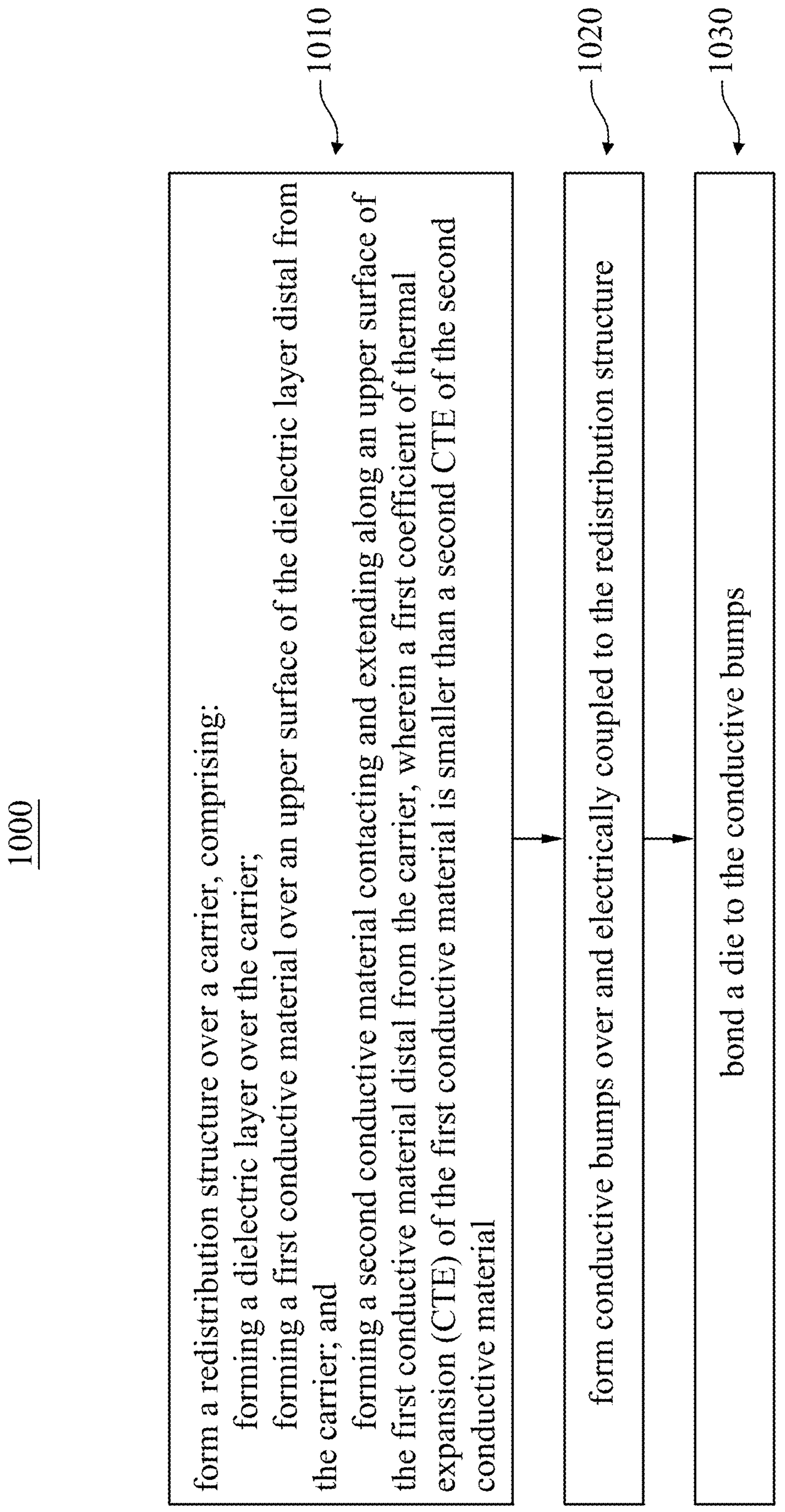
FIG. 8 illustrates a flow chart of a method of forming a semiconductor device, in some embodiments.

FIG. 8 illustrates a flow chart of a method 1000 of forming a semiconductor device, in some embodiments. It should be understood that the embodiment method 1000 shown in FIG. 8 is merely an example of many possible embodiment methods. One of ordinary skill in the art would recognize many variations, alternatives, and modifications. For example, various steps as illustrated in FIG. 8 may be added, removed, replaced, rearranged and repeated.

Referring to FIG. 8, at block 1010, a redistribution structure is formed over a carrier, comprising: forming a dielectric layer over the carrier; forming a first conductive material over an upper surface of the dielectric layer distal from the carrier; and forming a second conductive material contacting and extending along an upper surface of the first conductive material distal from the carrier, wherein a first coefficient of thermal expansion (CTE) of the first conductive material is smaller than a second CTE of the second conductive material. At block 1020, conductive bumps are formed over and electrically coupled to the redistribution structure. At block 1030, a die is bonded to the conductive bumps.

In accordance with an embodiment, a semiconductor device comprises: a die having die connectors at a front side of the die; a molding material around the die; and a redistribution structure, wherein the die connectors of the die are attached to a first side of the redistribution structure, wherein the redistribution structure comprises: a dielectric layer; a conductive line extending along a first surface of the dielectric layer facing the die; and a warpage tuning layer contacting and extending along a first surface of the conductive line facing the die, wherein a first coefficient of thermal expansion (CTE) of the conductive line is smaller than a second CTE of the warpage tuning layer.

In accordance with an embodiment, a semiconductor device comprises: a die embedded in a molding material; and a redistribution structure bonded to die connectors of the die, the redistribution structure comprising: a dielectric layer; a multi-metallic layer extending along a first surface of the dielectric layer facing the die, wherein the multi-metallic layer comprises a first metal layer having a first coefficient of thermal expansion (CTE), and comprises a second metal layer having a second CTE different from the first CTE, wherein the second metal layer is between the first metal layer and the die; and a via over and electrically coupled to the multi-metallic layer.

In accordance with an embodiment, a method of forming a semiconductor device comprises: forming a redistribution structure over a carrier, comprising: forming a dielectric layer over the carrier; forming a first conductive material over an upper surface of the dielectric layer distal from the carrier; and forming a second conductive material contacting and extending along an upper surface of the first conductive material distal from the carrier, wherein a first coefficient of thermal expansion (CTE) of the first conductive material is smaller than a second CTE of the second conductive material. The method further comprises: forming conductive bumps over and electrically coupled to the redistribution structure; and bonding a die to the conductive bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
- forming a redistribution structure over a carrier, comprising:
  - forming a first dielectric layer over the carrier;
  - forming a first conductive line over an upper surface of the first dielectric layer distal from the carrier; and
  - forming a warpage tuning material on an upper surface of the first conductive line distal from the carrier, wherein the warpage tuning material covers the upper surface of the first conductive line and exposes the upper surface of the first dielectric layer, wherein a first coefficient of thermal expansion (CTE) of the first conductive line is smaller than a second CTE of the warpage tuning material;
- forming conductive bumps over and electrically coupled to a first side of the redistribution structure; and
- bonding a die to the conductive bumps.

2. The method of claim 1, wherein the first conductive line and the warpage tuning material are formed using a same mask layer such that the warpage tuning material overlaps the first conductive line.

3. The method of claim 1, wherein forming the redistribution structure further comprises:
- after forming the warpage tuning material, removing a portion of the warpage tuning material from the upper surface of the first conductive line, wherein after removing the portion of the warpage tuning material, a remaining portion of the warpage tuning material on the upper surface of the first conductive line forms a warpage tuning layer, wherein the warpage tuning layer covers a first region of the upper surface of the first conductive line and exposes a second region of the upper surface of the first conductive line.

4. The method of claim 3, wherein a first sidewall of the warpage tuning layer is flush with a first sidewall of the first conductive line, and a second opposing sidewall of the warpage tuning layer is recessed from a second opposing sidewall of the first conductive line.

5. The method of claim 4, wherein the warpage tuning layer has a first width measured between the first sidewall of the warpage tuning layer and the second opposing sidewall of the warpage tuning layer, wherein the first conductive line has a second width measured between the first sidewall of the first conductive line and the second opposing sidewall of the first conductive line, wherein a ratio between the first width and the second width is between about 0.2 and about 1.0.

6. The method of claim 3, wherein forming the redistribution structure further comprises, after removing the portion of the warpage tuning material, forming a via over and contacting the second region of the upper surface of the first conductive line.

7. The method of claim 6, wherein the via is laterally spaced apart from the warpage tuning layer.

8. The method of claim 1, wherein forming the redistribution structure further comprises, after forming the warpage tuning material on the upper surface of the first conductive line:

forming a second dielectric layer over the warpage tuning material and the first dielectric layer;

forming a second conductive line over an upper surface of the second dielectric layer distal from the carrier; and forming a third dielectric layer over the second dielectric layer without forming the warpage tuning material on the second conductive line.

9. The method of claim 1, wherein the first conductive line is formed of a first metal material, wherein the warpage tuning material is a second metal material different from the first metal material.

10. The method of claim 1, wherein the first conductive line is formed of a metal material, wherein the warpage tuning material is a non-metal material.

11. The method of claim 1, wherein the warpage tuning material is formed on the upper surface of the first conductive line at a temperature higher than room temperature.

12. The method of claim 1, further comprising, after bonding the die:

removing the carrier to expose a second opposing side of the redistribution structure;

attaching the second opposing side of the redistribution structure to a substrate; and attaching a ring to the substrate around the redistribution structure and the die.

13. A method of forming a semiconductor device, the method comprising:

forming a redistribution structure over a carrier, comprising:

forming a dielectric layer over the carrier;

forming a conductive line extending along an upper surface of the dielectric layer distal from the carrier;

covering an upper surface of the conductive line distal from the carrier with a warpage tuning material, wherein the upper surface of the dielectric layer is exposed by the warpage tuning material, wherein a first coefficient of thermal expansion (CTE) of the conductive line is different from a second CTE of the warpage tuning material; and forming a via over and electrically coupled to the conductive line;

forming conductive bumps over and electrically coupled to a first side of the redistribution structure; and bonding a die to the conductive bumps.

14. The method of claim 13, wherein the second CTE of the warpage tuning material is higher than the first CTE of the conductive line.

15. The method of claim 14, wherein the warpage tuning material is an electrically conductive material.

16. The method of claim 13, wherein forming the redistribution structure further comprises, after covering the upper surface of the conductive line and before forming the via:

removing a first portion of the warpage tuning material from the upper surface of the conductive line, wherein after removing the first portion of the warpage tuning material, a second remaining portion of the warpage tuning material remains and forms a warpage tuning layer on the upper surface of the conductive line.

17. The method of claim 16, wherein the warpage tuning layer covers a first region of the upper surface of the conductive line and exposes a second region of the upper surface of the conductive line, wherein the via contacts the second region of the upper surface of the conductive line.

18. A method of forming a semiconductor device, the method comprising:

forming a redistribution structure over a carrier, comprising:

forming a dielectric layer over the carrier;

forming a conductive line extending along an upper surface of the dielectric layer distal from the carrier;

forming a warpage tuning material on an upper surface of the conductive line distal from the carrier, wherein the warpage tuning material covers the upper surface of the conductive line and exposes the upper surface of the dielectric layer, wherein a coefficient of thermal expansion (CTE) of the warpage tuning material is different from that of the conductive line;

removing a portion of the warpage tuning material from the upper surface of the conductive line, wherein after the removing, a remaining portion of the warpage tuning material forms a warpage tuning layer that partially covers the upper surface of the conductive line; and forming a via over and electrically coupled to the conductive line;

forming a conductive bump over and electrically coupled to the via; and bonding a die to the conductive bump.

19. The method of claim 18, wherein the warpage tuning layer exposes a first region of the upper surface of the conductive line, wherein the via is connected to the first region of the upper surface of the conductive line.

20. The method of claim 18, wherein the CTE of the warpage tuning material is higher than that of the conductive line.

* * * * *